United States Patent
Mauer et al.

(10) Patent No.: US 7,260,154 B1
(45) Date of Patent: Aug. 21, 2007

(54) METHOD AND APPARATUS FOR IMPLEMENTING A MULTIPLE CONSTRAINT LENGTH VITERBI DECODER

(75) Inventors: Volker Mauer, Bucks (GB); Alejandro Diaz-Manero, West Drayton (GB); Martin Langhammer, Poole (GB)

(73) Assignee: Altera Corporation, San Jose, CA (US)

( * ) Notice: Subject to any disclaimer, the term of this patent is extended or adjusted under 35 U.S.C. 154(b) by 758 days.

(21) Appl. No.: 10/331,707

(22) Filed: Dec. 30, 2002

(51) Int. Cl.
*H04L 5/12* (2006.01)

(52) U.S. Cl. ............ 375/265; 375/341; 714/792; 714/795; 714/796

(58) Field of Classification Search ......... 375/262, 375/265, 341; 714/786, 792, 794, 795, 796
See application file for complete search history.

(56) References Cited

U.S. PATENT DOCUMENTS

| | | | | |
|---|---|---|---|---|
| 5,327,441 A | * | 7/1994 | Kawazoe et al. | 714/795 |
| 6,448,910 B1 | * | 9/2002 | Lu | 341/51 |
| 7,035,356 B1 | * | 4/2006 | Langhammer | 375/341 |
| 2002/0106033 A1 | * | 8/2002 | Uesugi | |
| 2003/0123579 A1 | * | 7/2003 | Safavi et al. | |

* cited by examiner

*Primary Examiner*—Dac V. Ha
(74) *Attorney, Agent, or Firm*—L. Cho

(57) ABSTRACT

A Viterbi decoder capable of decoding a code having a maximum constraint length of $L_{max}$ is disclosed. The Viterbi decoder includes an initializer unit that initializes selected states of an encoder during an initial time period to allow the Viterbi decoder to also decode codes having a constraint length less than $L_{max}$.

41 Claims, 15 Drawing Sheets

US 7,260,154 B1

METHOD AND APPARATUS FOR IMPLEMENTING A MULTIPLE CONSTRAINT LENGTH VITERBI DECODER

BACKGROUND

Field of the Invention

The present invention relates to decoders. More specifically, the present invention relates to a method and apparatus for implementing a multiple constraint length Viterbi decoder for decoding convolutional codes having multiple constraint lengths.

Viterbi decoding, also known as maximum likelihood decoding and forward dynamic programming, is one method for decoding convolutional codes. Viterbi decoding finds a sequence of bits that is closest to an actual received sequence. The Viterbi algorithm uses the redundancy imparted by a convolutional encoder to decode the bit stream and remove errors. Viterbi decoding uses an asymptotically optimum decoding technique. The decoding technique is based on the assumption that a channel is memoryless, therefore there are a finite number of possible states in a decoder, and that given two consecutive states the input bits that cause a state transition between the two consecutive states can be predicted. By creating a trellis of possible states and possible state transitions, a path through the trellis could be traced back based on information such as branch metrics and state metrics and the encoded data can be decoded.

Viterbi decoders of the past were designed to decode convolutional codes having a single constraint length. Using a decoder configured to decode convolutional codes having a constraint length L to decode a convolutional code having any other constraint length may cause errors to occur that would generate inaccurate results. Additional hardware in the form of an additional decoder was required to process convolutional codes having multiple constraint lengths. This, however, requires additional device resources that translated to additional cost and additional space.

Thus, what is needed is an efficient and effective method and apparatus for implementing a multiple constraint length Viterbi decoder for decoding convolutional codes.

SUMMARY

A Viterbi decoder is disclosed that is configurable to support Viterbi codes having multiple constraint lengths. By initializing select states of the encoder upon reset, the Viterbi decoder may utilize its existing hardware to support not only the longest constraint length code it is designed to process, but also shorter constraint length codes.

A method for performing Viterbi decoding is disclosed according to an embodiment of the present invention. A constraint length of a code received $L_{current}$, is determined. Selected states of an encoder are initialized during an initial time period in response to $L_{current}$, and a maximum constraint length of a code that is supported $L_{max}$. According to one aspect of the invention, initializing the selected states of the encoder during the initial timer period includes assigning a unique state metric value to state 0, and every $2\exp(L_{current}-1)$ following state.

A Viterbi decoder is disclosed according to an embodiment of the present invention. The Viterbi decoder is capable of decoding a code having a maximum constraint length of $L_{max}$. The Viterbi decoder includes an initializer unit that initializes selected states of an encoder during an initial time period to allow the Viterbi decoder to also decode codes having a constraint length less than $L_{max}$. According to one aspect of the invention, the initializer unit assigns a unique state metric value to $2\exp(L_{max}-L_{current})$ states of the encoder.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be single signal lines, and each of the single signal lines may alternatively be buses.

Figure 1:
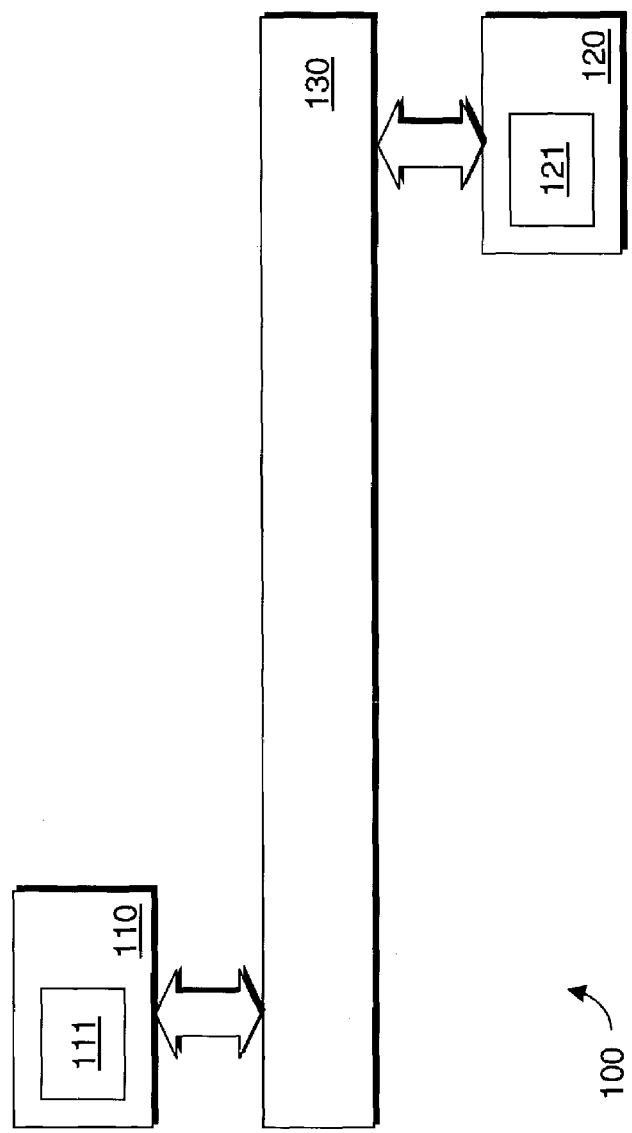
FIG. 1 is a block diagram illustrating a network implementing convolutional encoding and Viterbi decoding according to an embodiment of the present invention.

FIG. 1 is a block diagram illustrating a network 100 according to an embodiment of the present invention. The network 100 includes a data transmitter 110 and a data receiver 120. The data transmitter 110 transmits data to the data receiver 120 over transmission channel 130. Forward error correction (FEC) is used by the network 100 to improve the capacity of transmission channel 130 by adding redundant information to the data being transmitted through the transmission channel 130.

The data transmitter 110 includes a convolutional encoder 111. The convolutional encoder 111 performs the process of adding redundant information known as channel coding. The convolutional encoder 111 convolutes input bits to be transmitted onto the transmission channel 130 into output bits. According to an embodiment of the present invention, the convolutional encoder 111 includes a shift register and combinational logic that performs modulo-two addition (not shown). Typically, a convolutional encoder can be characterized by its rate and the generating polynomials. A convolutional encoder's rate is defined as the number of transmitted bits per input bit, e.g., a rate 1/2 encodes 1 bit and produces 2 bits for transmission. A convolutional encoder's generator polynomials denote the convolutional encoder state bits which are mathematically combined to produce an encoded bit. There is one generator polynomial per encoded bit. The length in bits of the generating polynomial is called the constraint length. The constraint length of the generator polynomials associated with defining the convolutional encoder and is generated convolutional codes is $L_{current}$.

The data receiver 120 includes a Viterbi decoder 121. According to an embodiment of the present invention, the Viterbi decoder 121 decodes the encoded data received from the data transmitter 110 by creating a trellis of possible states and possible state transitions, and tracing back a path through the trellis based on branch metric and state metric calculations. The Viterbi decoder 121 includes circuitry that supports decoding convolutional codes having a maximum constraint length of $L_{max}$. The Viterbi decoder 121 may be configured such that it supports decoding convolutional codes having constraint length of $L_{max}-n$, where n is less than or equal to $L_{max}-2$. It should be appreciated that the data transmitter 110 and the data receiver 120 may also be configured to transmit and receive and encode and decode data.

Figure 2:
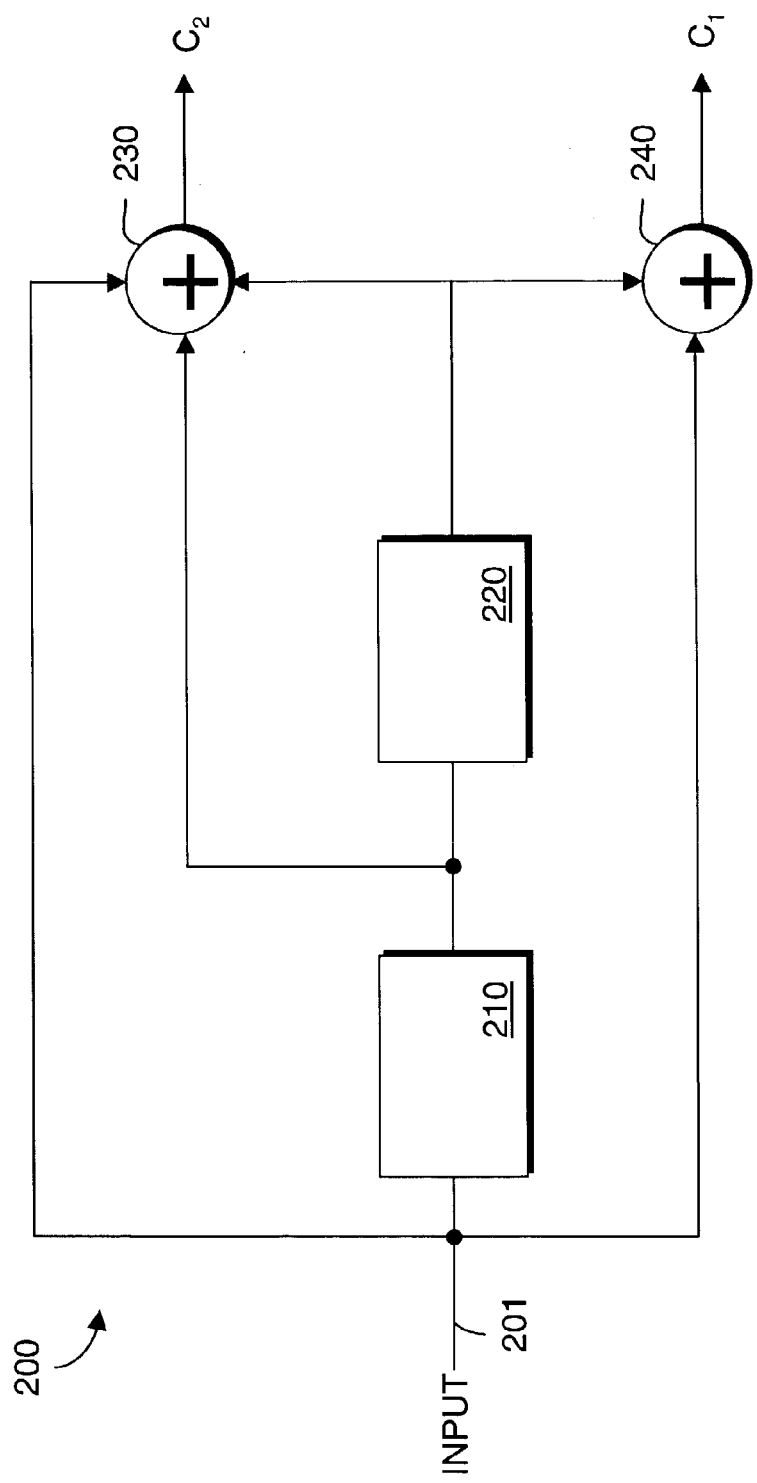
FIG. 2 is a block diagram illustrating a convolutional encoder according to an embodiment of the present invention.

FIG. 2 illustrates an exemplary convolutional encoder 200 according to an embodiment of the present invention. The convolutional encoder 200 may be implemented as the convolutional encoder 111 shown in FIG. 1. The convolutional encoder 200 includes a two-bit shift register, implemented by flip-flops 210 and 220, and circuits 230 and 240 that perform XOR functions. Input bits enter at input line 201. Outputs C2 and C1 are generated for each input bit. Output C2 is generated by performing an XOR function on all the bits in the shift register. Output C1 is generated by performing an XOR function on the input bit with the bit in flip-flop 220. The bit values stored in the flip-flops 210 and 220 define the state of the convolutional encoder 200.

The exemplary convolutional encoder 200 shown in FIG. 2 includes L−1 bit stages and n linear algebraic function generators where there are n number of output bits for each k-bit input sequence. The code rate of the convolutional encoder 200 is 1/2 and the constraint length of the convolutional code is 3. The generator polynomials of the encoder 200 are 111, and 101. It should be appreciated that the convolutional encoder 200 may be implemented using other known circuitry and techniques and that convolutional encoder 200 may be implemented to have other code rates and constraint lengths.

Figure 3:
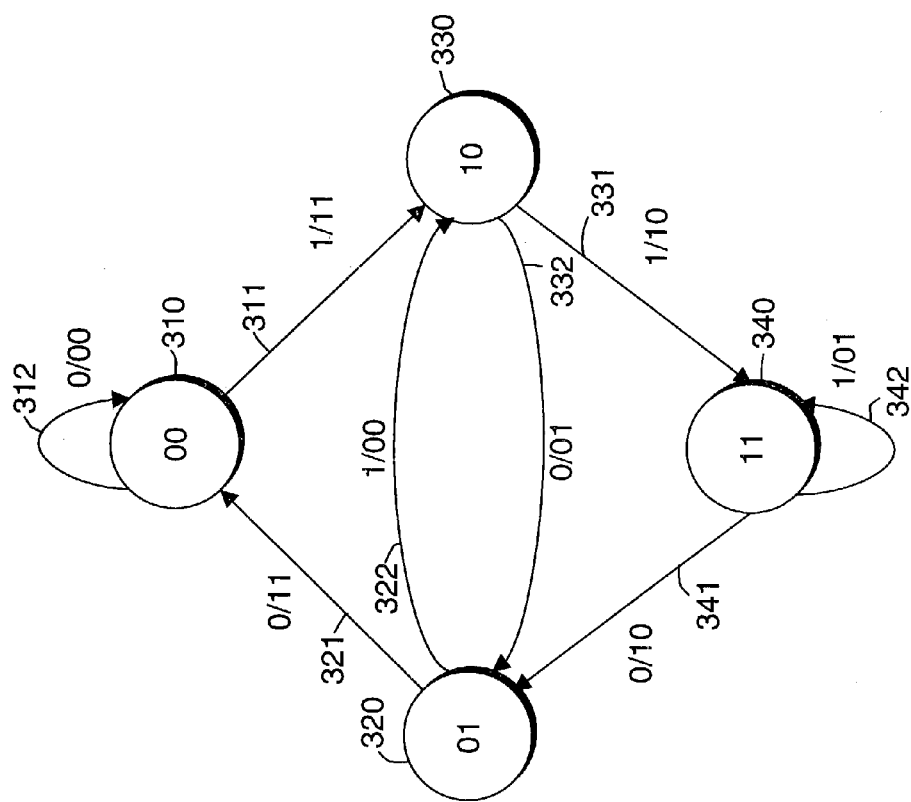
FIG. 3 is a state diagram illustrating the states of the convolutional encoder in FIG. 2.

FIG. 3 is a state diagram 300 illustrating the states of the convolutional encoder 200 shown in FIG. 2. The circles 310, 320, 330, and 340 represent states of the convolutional encoder 200. The values along the arrows in FIG. 3 represent the input and output bits of the encoder. Circle 310 represents state 00. While in state 00, if an input bit to the encoder 200 is 0, the output of the encoder 200 will be 00 and the next state will again be 00. While in state 00, if an input bit to the encoder 200 is 1, the output of the encoder will be 11 and the next state will be 10. Circle 320 represents state 01. While in state 01, if an input bit to the encoder 200 is 0, the output of the encoder 200 will be 11 and the next state will be 00. While in state 01, if an input bit to the encoder 200 is 1, the output of the encoder will be 00 and the next state will be 10. Circle 330 represents state 10. While in state 10, if an input bit to the encoder 200 is 0, the output of the encoder 200 will be 01 and the next state will be 01. While in state 10, if an input bit to the encoder 200 is 1, the output of the encoder will be 10 and the next state will be 11. Circle 340 represents state 11. While in state 11, if an input bit to the encoder 200 is 0, the output of the encoder 200 will be 10 and the next state will be 01. While in state 11, if an input bit to the encoder 200 is 1, the output of the encoder will be 01 and the next state will again be 11.

Figure 4:
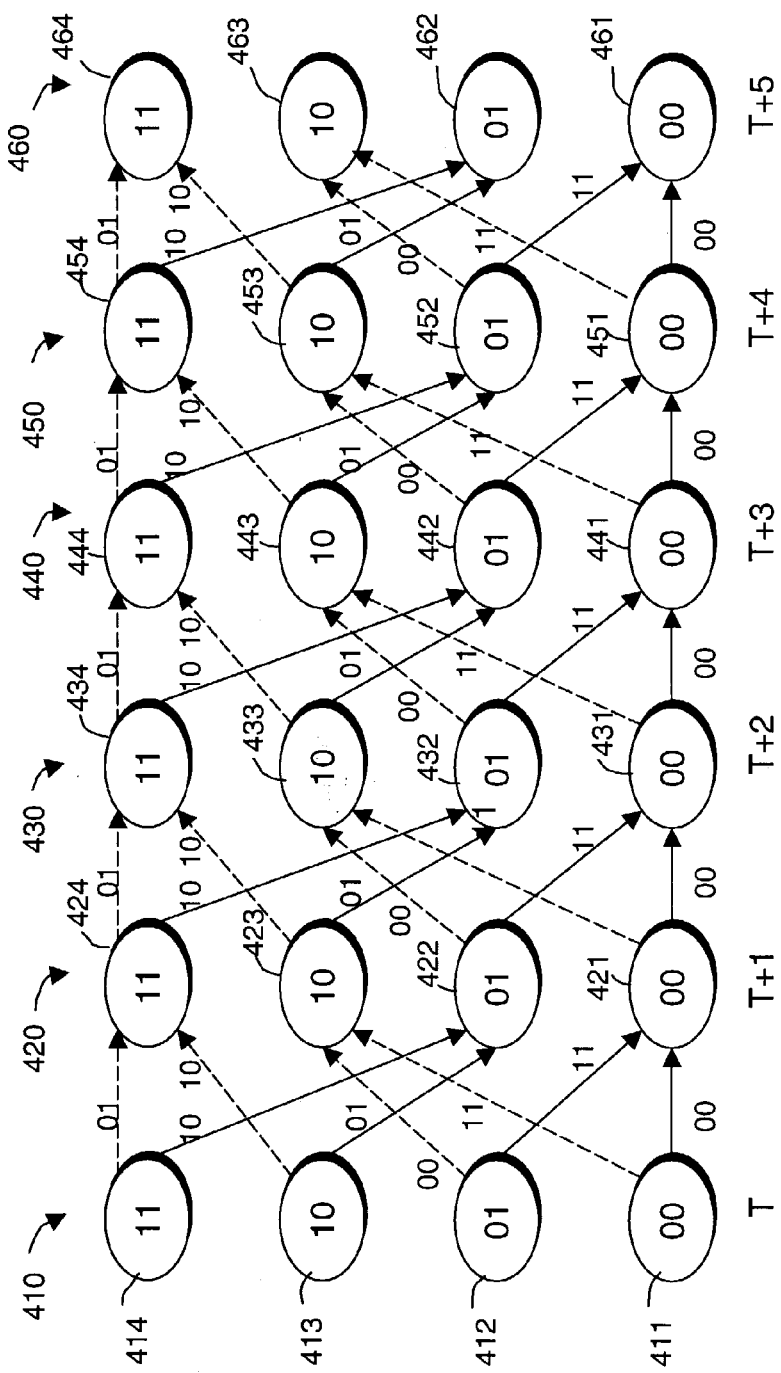
FIG. 4 is a trellis diagram illustrating the states of the convolutional encoder in FIG. 2 over a period of four time intervals.

FIG. 4 is a trellis diagram illustrating the states of the convolutional encoder 200 shown in FIG. 2. The trellis diagram illustrates the possible states of the convolutional encoder 200 during six time periods. A first column of circles 410 includes circles 411-414 that represent possible states 00, 01, 10, and 11 respectively. The first column of circles 410 represents possible states of the convolutional encoder 200 during time period T. A second column of circles 420 includes circles 421-424 that represent possible states 00, 01, 10, and 11 respectively. The second column of circles 420 represents possible states of the convolutional encoder 200 during time period T+1. A third column of circles 430 includes circles 431-434 that represent possible states 00, 01, 10, and 11 respectively. The third column of circles 430 represents possible states of the convolutional encoder 200 during time period T+2. A fourth column of circles 440 includes circles 441-444 that represents possible states 00, 01, 10, and 11 respectively. The fourth column of circles 440 represent possible states of the convolutional encoder 200 during time period T+3. A fifth column of circles 450 includes circles 451-454 that represents possible states 00, 01, 10, and 11 respectively. The fifth column of circles 450 represent possible states of the convolutional encoder 200 during time period T+4. A sixth column of circles 406 includes circles 461-464 that represents possible states 00, 01, 10, and 11 respectively. The sixth column of circles 460 represent possible states of the convolutional encoder 200 during time period T+5.

Each of the possible states represented by circles 411-414, 421-424, 431-434, 431-434, 441-444, 451-454, and 461-464 has a dotted arrow and a solid arrow extending to a circle that represent another state in the next time period. The dotted arrow represents a path to a state in the next time period when the input bit to the convolutional encoder 200 is 1. The solid arrow represents a path to a state in the next time period when the input bit to the convolutional encoder is 0. The output values (C1, C2) generated by the convolutional encoder 200 in response to the inputs are shown next to the arrows. Although FIG. 4 shows a trellis diagram of the possible states during six time intervals, it should be appreciated that a time interval may be shown for each output of the convolutional encoder 200.

Figure 5:
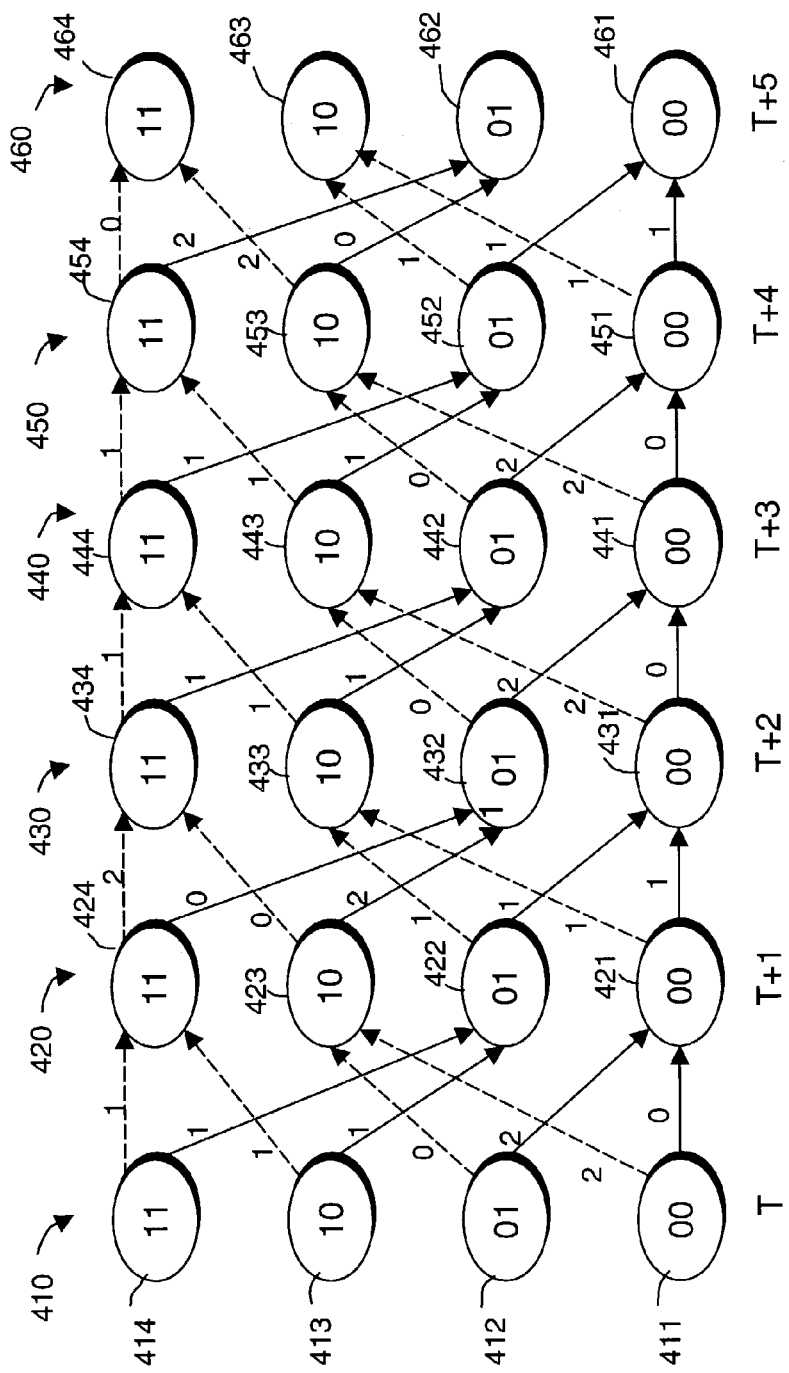
FIG. 5 is a trellis diagram illustrating exemplary branch metrics calculated for the paths between states of the encoder of FIG. 2.

FIG. 5 is a trellis diagram that illustrates exemplary branch metrics value for the paths that lead to the states during time interval T through T+5. In this example, convolutional encoder 200 (shown in FIG. 2) receives input values 1, 0, 0, 1, 1 and generates and transmits coded values (C1, C2) 11, 01, 11, 11, 10 during time periods T through T+4 respectively. According to an embodiment of the present invention, branch metric values are calculated by comparing the coded values received by the decoder 120 (shown in FIG. 1) with the possible output values generated by the convolutional encoder 200 during each state. Branch metric values may be computer for each path between states, for example, by counting matching bits received during a time interval. It should be appreciated that other techniques may be used to generate branch metric values. The branch metric values for each path are shown next to each path.

Figure 6:
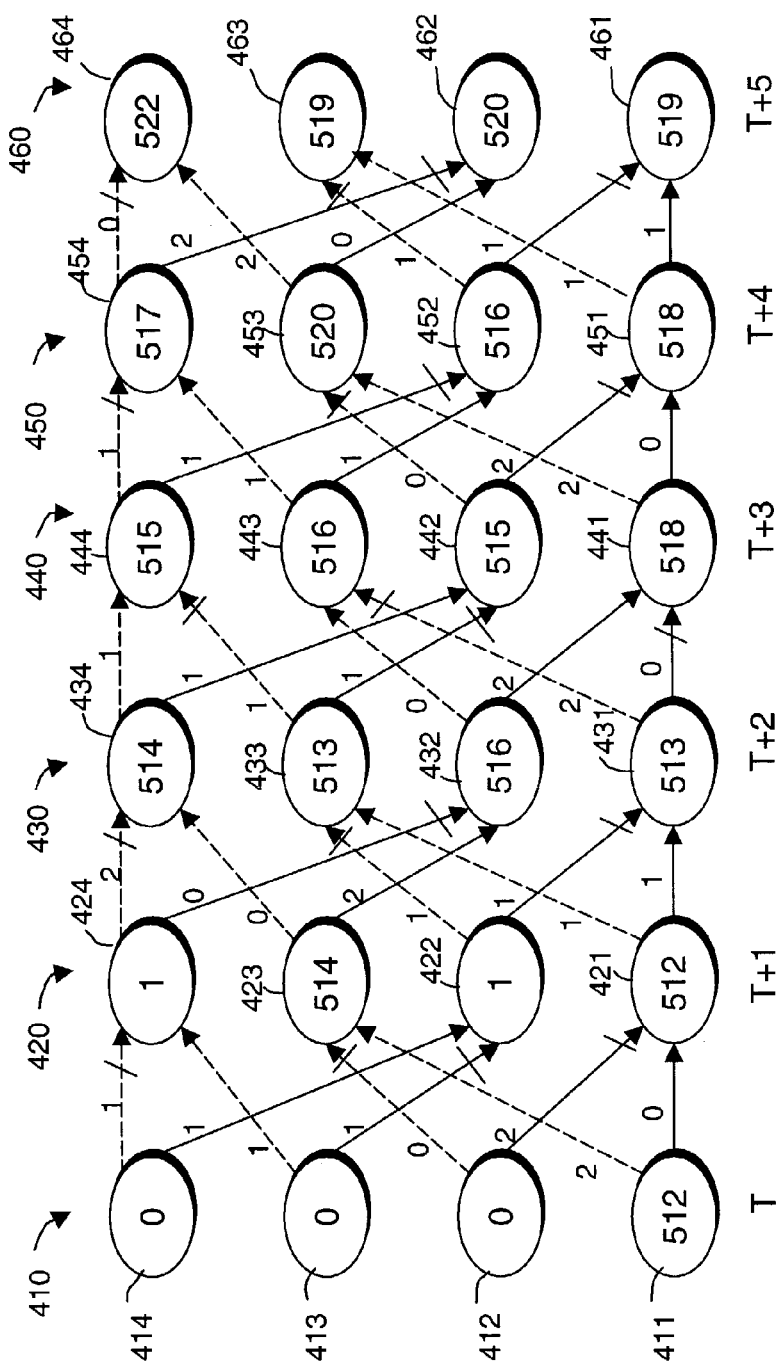
FIG. 6 is a trellis diagram illustrating exemplary state metrics and survivor paths determined for the states of the encoder of FIG. 2.

FIG. 6 is a trellis diagram that illustrates the state metrics and survivor paths for the states during time intervals T through T+5. The state metrics for states 00, 01, 10, and 11 at time period T, represented by circles 411-414, are assigned values 512, 0, 0, and 0 for the purposes of this example. State 00 is initialized with a higher value than states 01, 10, and 11. This is done since it is known that at time interval T, the traceback path should be at state 00. Initializing state 00 with a higher value makes use of this prior knowledge. The state metric values for each state are shown inside the circle representing the state. According to an embodiment of the present invention, a state metric of a state is determined by summing the branch metric for each path to the state with the state metric of the state originating the path, and selecting the sum having the larger value as the state metric for the state. The path associated with the state metric value is designated as the survivor path leading to the state. It should be appreciated that other techniques may be used to calculate state metric values and for selecting survivor paths. Each non-surviving path to a state is marked with a line through it.

Figure 7:
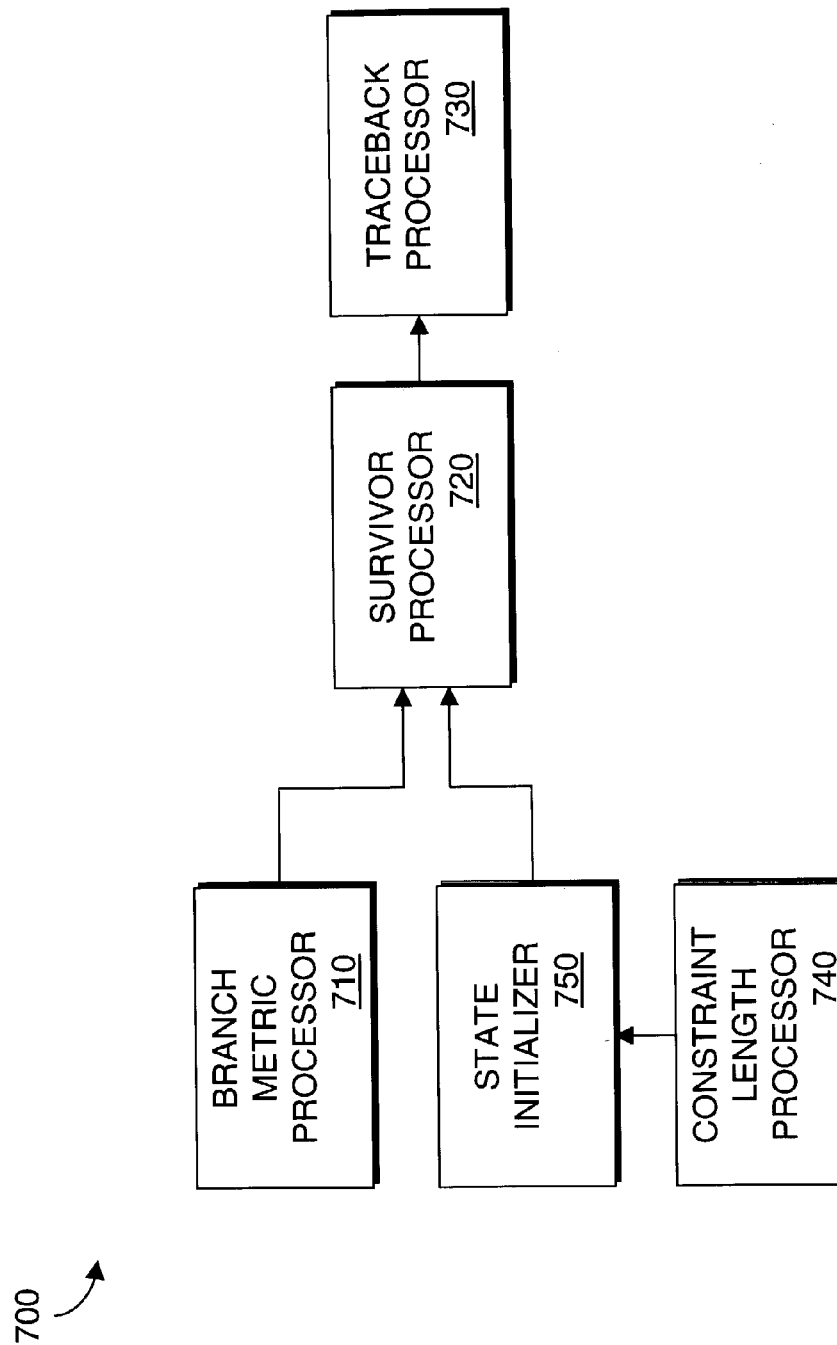
FIG. 7 is a block diagram of a Viterbi decoder according to an embodiment of the present invention.

FIG. 7 is a block diagram of a Viterbi decoder 700 according to an embodiment of the present invention. The Viterbi decoder 700 may be implemented in the Viterbi decoder 121 shown in FIG. 1. The Viterbi decoder 700 includes a branch metric processor 710, survivor processor 720, and traceback processor 730. The branch metric processor 710, survivor processor 720, and traceback processor 730 include hardware that allows the Viterbi decoder 700 to decode codes having constraint lengths of 2 up to $L_{max}$. In processing codes, the branch metric processor 710, survivor processor 720, and traceback processor 730 model and process trellis diagrams having states, and branch metric values as if the constraint lengths of the codes have the value of $L_{max}$ regardless of the actual constraint lengths of the code.

Figure 8:
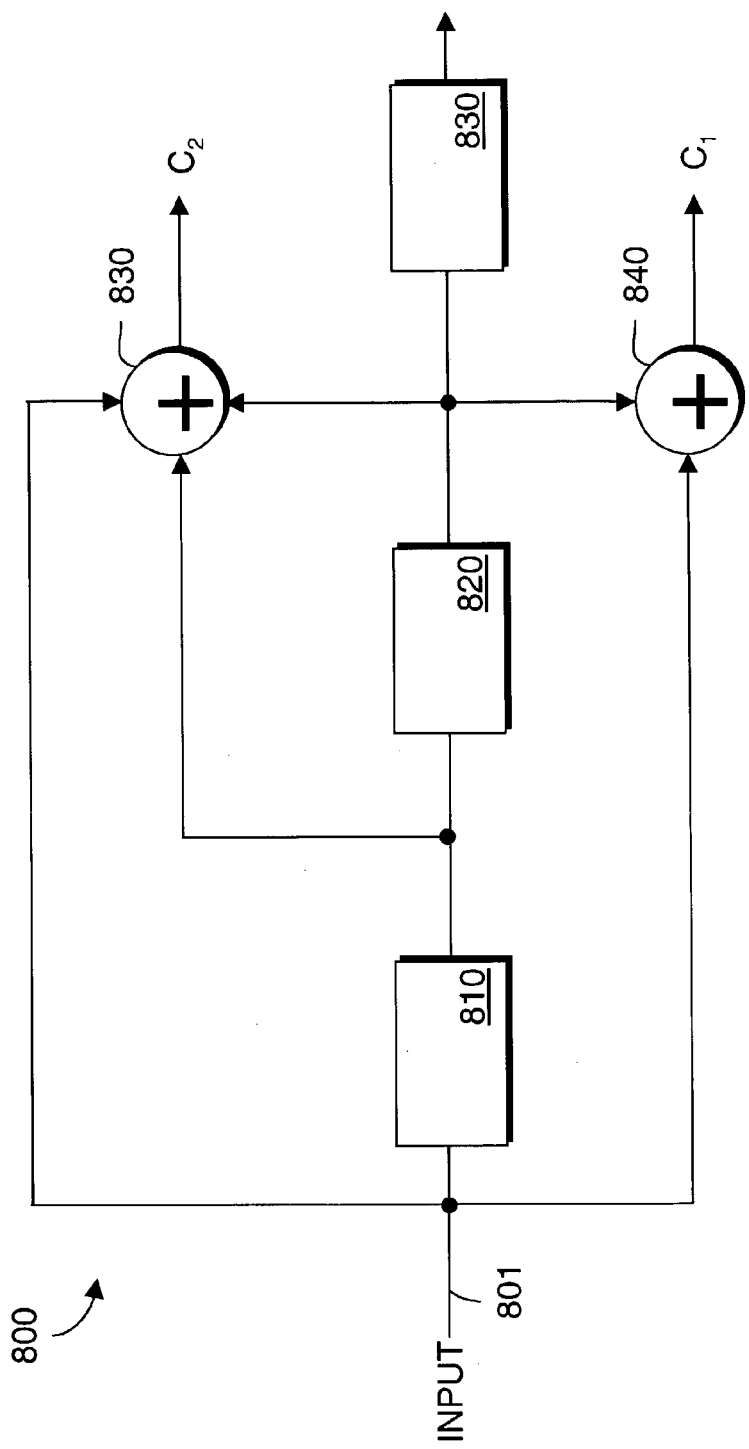
FIG. 8 is a block diagram illustrating the convolutional encoder shown in FIG. 2 as effectively viewed by the Viterbi decoder shown in FIG. 7.

For example, if the Viterbi decoder 700 is to decode code from convolutional encoder 200 (shown in FIG. 2), the Viterbi decoder will model a trellis for the code as if the constraint length of the code is $L_{max}$, even when the convolutional encoder generates code having a constraint length of 3. If $L_{max}$ has the value of 4, the convolutional encoder 200 will be effectively viewed as if it had generator polynomial values 1110 and 1010. FIG. 8 illustrates a convolutional encoder 800 having generator polynomial values 1110 and 1010. The convolutional encoder 800 is effectively seen as the encoder 200 by the Viterbi decoder 700. The convolutional encoder 800 includes a three-bit shift register, implemented by flip-flops 810, 820, and 820, and circuits 830 and 840 that perform XOR functions. Input bits enter at input line 801. Outputs C2 and C1 are generated for each input bit. The bit values stored in the flip-flops 810, 820, and 830 define the state of the convolutional encoder 800.

Figure 9:
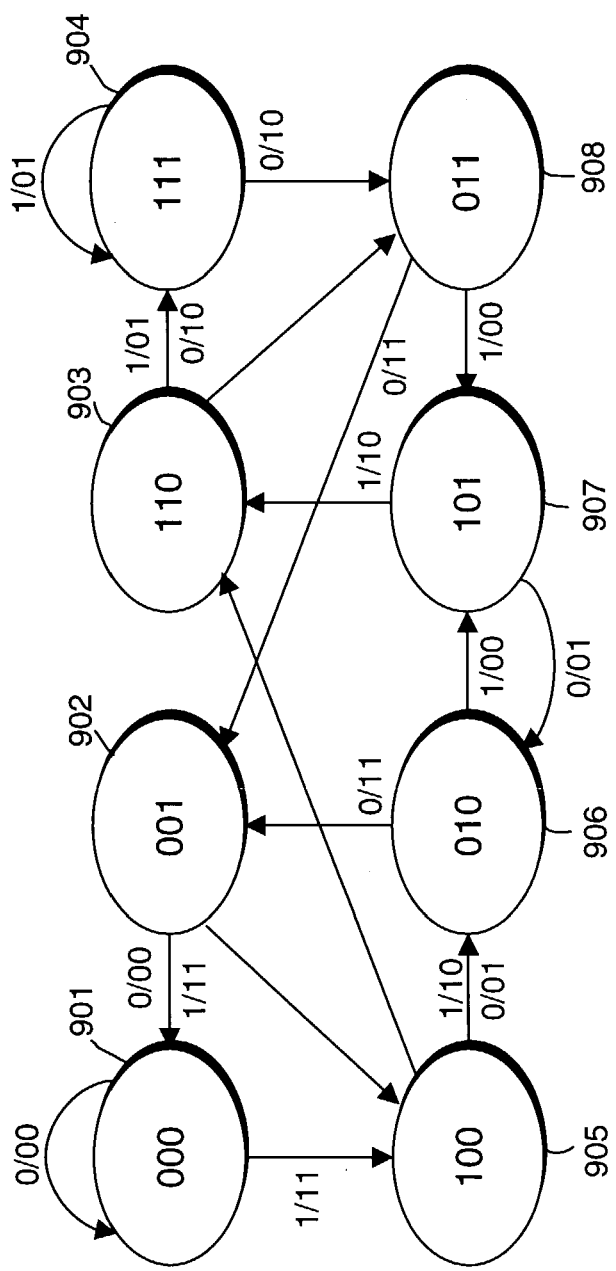
FIG. 9 is a state diagram illustrating the states of the convolutional encoder of FIG. 8.

FIG. 9 is a state diagram that illustrates the states of the encoder 800. The states shown in FIG. 9 is effectively seen as the states of the encoder 200 by the Viterbi decoder 700. The circles 901-908 represent states of the convolutional encoder 800 where the 3-bit values written inside each circle represents a state. The values along the arrows in FIG. 9 represent the input and output bits of the encoder. The direction of each of the arrows indicate possible state transitions given the input shown.

Figure 10:
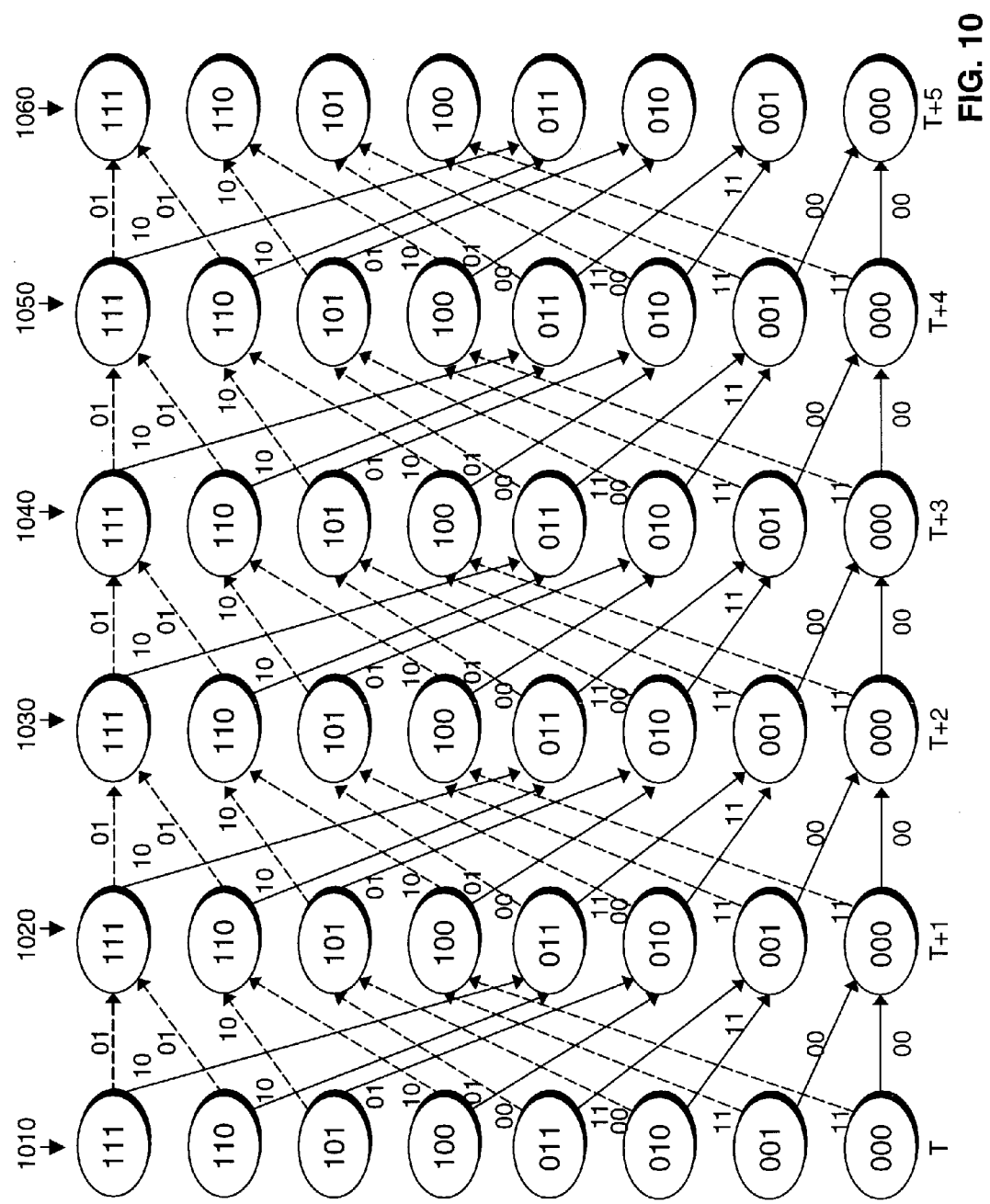
FIG. 10 is a trellis diagram illustrating the states of the convolutional encoder in FIG. 8 over time periods.

FIG. 10 is a trellis diagram illustrating the states of the encoder 800 over a period of time. The trellis shown in FIG. 10 is effectively seen by the Viterbi decoder 700 as the trellis for encoder 200. The trellis diagram illustrates the possible states of the convolutional encoder 800 over six time periods. Columns of circles 1010, 1020, 1030, 1040, 1050, and 1060 each include circles that represent possible states 000, 001, 010, 011, 100, 101, 110, and 111 during time periods T to T+5. Each of the possible states represented by the circles has a dotted arrow and a solid arrow extending to a circle that represent another state in the next time period. The dotted arrow represents a path to a state in the next time period when the input bit to the convolutional encoder 800 is 1. The solid arrow represents a path to a state in the next time period when the input bit to the convolutional encoder 800 is 0. The output values (C1, C2) generated by the convolutional encoder 800 in response to the inputs are shown next to the arrows. Although FIG. 8 shows a trellis diagram of the possible states during six time intervals, it should be appreciated that a time intervals may be shown for each output of the convolutional encoder 800.

Referring back to FIG. 7, the branch metric processor 710 receives the output bits transmitted by the data transmitter 110 (shown in FIG. 1) utilizing encoder 200. The branch metric processor 710 calculates branch metric values for paths leading to a state of the convolutional encoder 800. According to an embodiment of the present invention, branch metric values are calculated by comparing the coded values received with the possible output values generated by the convolutional encoder 800 during each state. Branch metric values may be computed for each path between states, for example, by counting matching bits received during a time interval. According to one embodiment, the branch metric processor 710 determines Correlation metrics. It should be appreciated that other techniques may be used to generate branch metric values.

Figure 11:
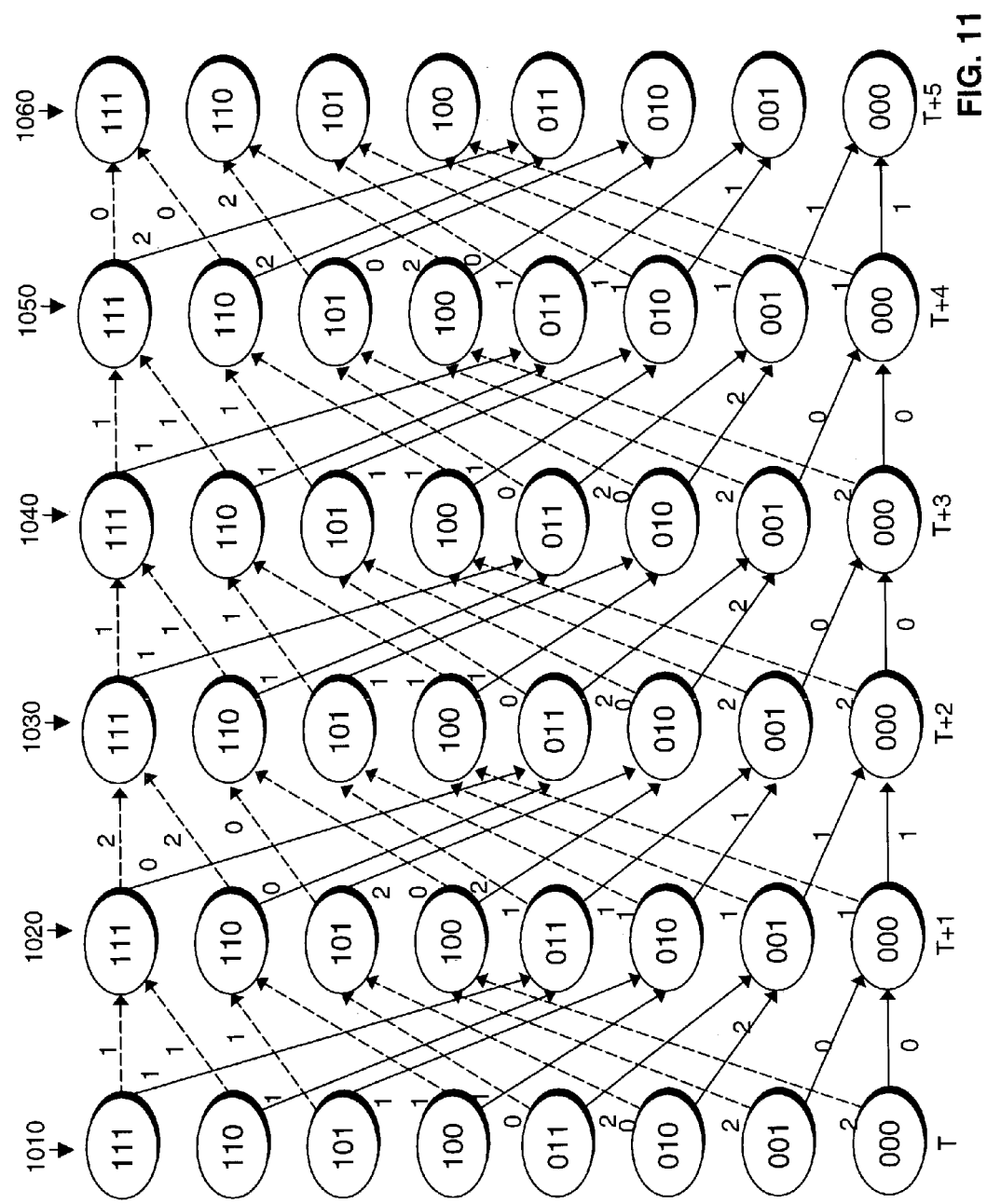
FIG. 11 is a trellis diagram illustrating exemplary branch metrics calculated for the paths between states of the encoder of FIG. 8.

FIG. 11 is a trellis diagram that illustrates exemplary branch metrics value for the paths that lead to the states during time intervals T through T+5. In this example, convolutional encoder 800 (shown in FIG. 8) receives input values 1, 0, 0, 1, 1 and generates and transmits coded values (C1, C2) 11, 01, 11, 11, 10 during time periods T through T+5 respectively.

Referring back to FIG. 7 the survivor processor 720 receives the branch metrics associated with paths to the states of the convolutional encoder 800 from the branch metric processor 710. The survivor processor 720 determines the state metrics for the states and survivor paths leading to each state. According to an embodiment of the Viterbi decoder 700, the survivor processor 720 determines the state metric of a state by summing the branch metric for each path to the state with the state metric of the state originating the path, and selecting the sum having the larger value as the state metric for the state. The path associated with the state metric value is designated as the survivor path leading to the state.

The Viterbi decoder 700 includes a constraint length processor 740. The constraint length processor 740 determines a constraint length of a code to be decoded by the Viterbi decoder 700. The constraint length processor 740 may determine the constraint length of a code from generator polynomials that define an encoder originating the code. According to one embodiment of the Viterbi decoder 700, the constraint length processor 740 performs an OR operation between terms of the generator polynomials of the same order to generate a combined generator polynomial value. The constraint length processor 740 determines a number of positions from the first "1" value to the last "1" value in the combined generator polynomial value and designates this value as the constraint length of the code.

For example if a first generator polynomial, G0, has the value 1110, and a second generator polynomial, G1, has the value 1010, the combined generator polynomial value is 1110. The number of positions from the first "1" value to the last "1" value in the combined generator polynomial is 3. The constraint length of the code is thus determined to be 3. According to an embodiment of the Viterbi decoder 700, the constraint lengths for codes to be decoded are determined prior to the receiving the codes. In this embodiment, the Viterbi decoder 700 is given the precise time when codes of a constraint length are to be received and when a change in constraint length is to take place.

The Viterbi decoder 700 includes a state initializer 750. The state initializer 750 initializes state metric values of selected states of an encoder at an initial time period. The state metric values of the selected states of the encoder at the initial time period are used to determine survivor paths in a trellis in order to decode coded data. The state initializer 750 initializes selected states of the encoder during an initial time period in response to a constraint length of a code, $L_{current}$, and a maximum constraint length of a code supported by the Viterbi decoder 700, $L_{max}$. According to an embodiment of the state metric processor 700, a unique state metric value is assigned to $2\exp(L_{max}-L_{current})$ states. When a forward trellis is computed, the state initializer 750 may assign a unique state metric value to state 0, and every $2\exp(L_{current}-1)$ following state. In other words, the state initializer 750 assigns the unique state metric value to all states having an index ending with $L_{max}-L_{current}$ zero(s). When a reverse trellis is computed, the state initializer 720 may assign a unique state metric value to states 0 to $(2\exp(L_{max}-L_{current})-1$ (i.e., all states whose indices start with $L_{max}-L_{current}$ zeros).

The unique value assigned to the selected states may be a value that is higher than those assigned to non-selected states during the initial time period when state metrics are determined by summing matching bits received. In this embodiment, non-selected states may be assigned a state metric value of "0". According to one embodiment, the selected states are initialized to a minimum of $(L_{current}-1)$ *max(bm), where $L_{current}$ is the constraint length, and max (bm) is the maximum branch metric value. It should be appreciated that higher values may also be used. After $L_{current}-1$, time periods, the unique value will have propagated to all other states. This value allows all states can be traced back to state 0 at time period $L_{current}-1$ when $L_{max}=L_{current}$. According to an alternate embodiment, the unique value is determined based on how large the state metric values can be. The unique value assigned to the selected states may be a value that is lower than those assigned to non-selected states during the initial time period when state metrics are determined by summing mis-matching bits received. In this embodiment, the selected states may be assigned a value of "0" while the non-selected states may be assigned a state metric value of $(L_{current}-1)*\max$ (bm).

Figure 12:
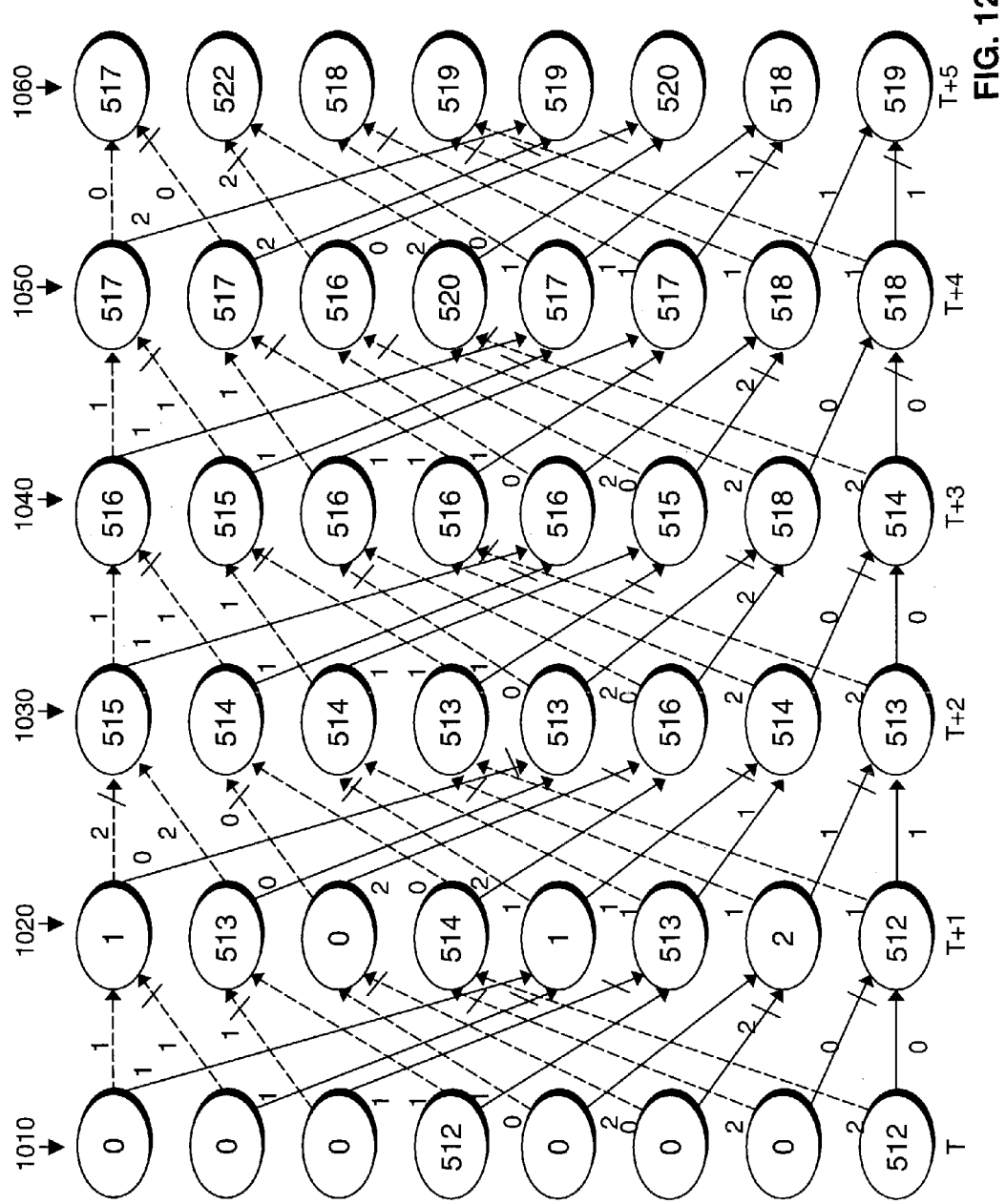
FIG. 12 is a trellis diagram illustrating exemplary state metrics and survivor paths determined for the states of the encoder of FIG. 8.

Thus, when the Viterbi decoder 700 receives code from the convolutional encoder 200, the constraint length processor 740 determines that the actual constraint length of the code is $L_{current}$ where $L_{current}$ is 3. The state initializer 750 initializes state metrics value for selected states of the encoder 800 during an initial period. The state initializer 750 determines that for $L_{max}=4$ and $L_{current}=3$, state 0 (000 in binary) and state 4 (100) are initialized with the unique value. This is shown in FIG. 12. FIG. 12 is a trellis diagram of the states of the convolution encoder 800 over a period of time. At the initial period T, states 0 and 4 are assigned the value 512, while non-selected states are assigned a value 0. FIG. 12 also illustrates the state metrics and survivor paths for the states during time interval T through T+5. The state metric values for each state are shown inside the circle representing the state. According to an embodiment of the present invention, a state metric of a state is determined by summing the branch metric for each path to the state with the state metric of the state originating the path, and selecting the sum having the larger value as the state metric for the state. The path associated with the state metric value is designated as the survivor path leading to the state. If multiple paths may be associated with a state metric for a state, the lower path is selected as the survivor path in this example. It should be appreciated that the higher path may be selected, a path may be randomly selected, or another selection techniques may be used. It should also be appreciated that other techniques may be used to calculate state metric values and for selecting survivor paths. Each non-surviving path to a state is marked with a line through it.

Referring back to FIG. 7, the traceback processor 730 processes information associated with the survivor paths determined by the survivor processor 720 and determines a traceback path back to the initial state. According to an embodiment of the traceback processor 730, traceback begins at a state having the largest state metric value and follows survivor paths through states back to the initial time period. If a plurality of states have the same state metric value, a state at the lowest position is selected as the state to begin traceback. According to an alternate embodiment of the present invention, it should be appreciated that a state at the highest position may be selected, that a state may be randomly selected, or other selection techniques may be used. In the example shown in FIG. 12, the traceback processor 730 begins the traceback path at a state 110. The traceback path continues through states 100, 001, 010, 100, and 000.

The Viterbi decoder 700 is capable of processing code having a constraint length from 2 to $L_{max}$ utilizing either forward or reverse trellis techniques. According to an embodiment of the Viterbi decoder 700, the branch metric processor 710, survivor processor 720, traceback processor 730, constraint length processor 740, and state initializer 750 may be implemented using any known circuitry or technique. In one embodiment, the branch metric processor 710, survivor processor 720, traceback processor 730, constraint length processor 740, and state initializer 750 all reside on a signal semiconductor substrate. In this embodiment, the branch metric processor 710, survivor processor 720, traceback processor 730, constraint length processor 740, and state initializer 750 may be implemented using a programmable logic device or a field programmable logic array.

According to an alternate embodiment of the present invention, the methods described are performed in response to a processor executing sequences of instructions contained in a memory. Such instructions may be read onto the memory, for example, for a computer-readable medium. It should be appreciated that, hard-wire circuitry may be used in place of or in combination with software instructions to implement the methods described. Thus, the present invention is not limited to any specific combination of hardware circuitry and software.

Figure 13:
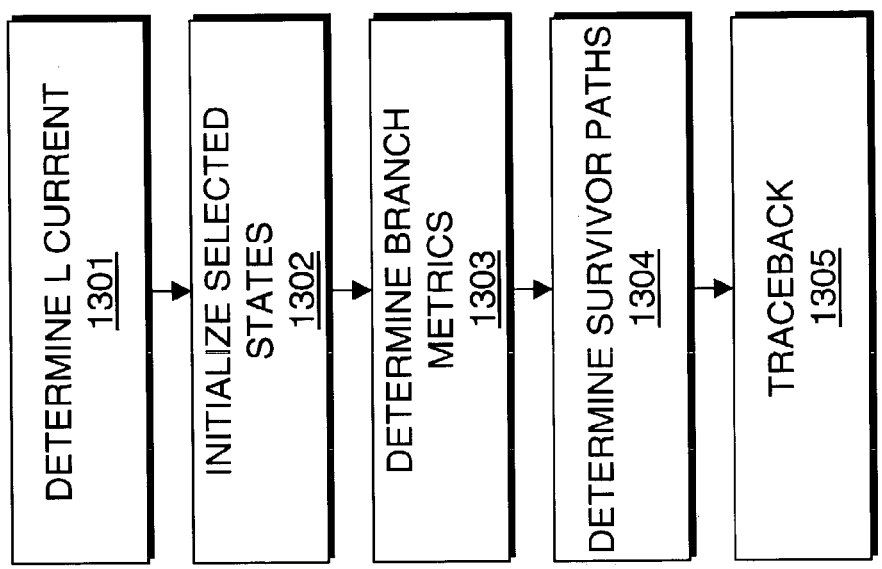
FIG. 13 is a flow chart illustrating a method for Viterbi decoding according to an embodiment of the present invention.

FIG. 13 is a flow chart illustrating a method for Viterbi decoding according to an embodiment of the present invention. At step 1301, a constraint length of a code to be decoded $L_{current}$ is determined. According to an embodiment of the present invention, the constraint length of the code to be decoded is determined from generator polynomials associated with the encoder generating the code.

At step 1302, selected states of an encoder are initialized during an initial time period in response to a constraint length of a code, $L_{current}$, and a maximum constraint length of a code supported $L_{max}$. According to an embodiment of the present invention, the selected states include $2\exp(L_{max}-L_{current})$ of the states. In this embodiment a unique state metric value is assigned to state 0, and every $2\exp(L_{current}-1)$ following state when a forward trellis is processed. States 0 to $(2\exp(L_{max}-L_{current}))-1$ are assigned the unique state metric value when a reverse trellis is processed. The unique value may be a value higher or lower than the values assigned to the non-selected states.

At step 1303, branch metrics for states of the encoder are determined. According to an embodiment of the present invention, determining branch metrics for states of the encoder is achieved by determining differences between values associated with the states of the encoder and a code received.

At step 1304, survivor paths between the states of the encoder are selected. According to an embodiment of the present invention, selecting the survivor paths between the states is achieved by determining the state metric of a state. The branch metric for each path to the state is summed with the state metric of the state originating the path. The sum having the larger value is selected as the state metric for the state. The path associated with the state metric value is designated as the survivor path leading to the state.

At step 1305, a path through the states of the encoder are traced back through the survivor paths. According to an embodiment of the present invention, tracing back a path through the states of the encoder through the survivor paths includes starting a traceback at a state having a highest state metric value at a time period.

FIG. 13 is a flow chart illustrating a method for selecting survivor paths and performing traceback in a Viterbi decoder. Some of the steps illustrated in these figures may be performed sequentially, in parallel or in an order other than that which is described. It should be appreciated that not all of the steps described are required to be performed, that additional steps may be added, and that some of the illustrated steps may be substituted with other steps.

It should be appreciated that the data transmitter 110 (shown in FIG. 1) may terminate an input data stream by including an additional number of zero values equal to the constraint length associated with its convolutional encoder 111 (shown in FIG. 1). By including a number of zero values equal to the constraint length associated with its convolutional encoder (FIG. 1), the path of the trellis would terminate at its initial state or state zero for the case where $L_{max}=L_{current}$. Thus, when $L_{max}=L_{current}$, the Viterbi decoder 700 (shown in FIG. 7) may begin traceback at state zero. However, when $L_{max}>L_{current}$, traceback may start at more than one state. In processing a forward trellis, the Viterbi decoder 700 may begin traceback at any one of states 0 to $(2\exp(L_{max}-L_{current}))-1$ (i.e., all states whose indices start with $L_{max}-L_{current}$ zeros). For a backward trellis, the Viterbi decoder 700 may begin traceback at any one of the states from state 0 and every $2\exp(L_{current}-1)$th state. The Viterbi decoder 700 determines the state with the largest state metric value and selects the state as the state to begin traceback.

Figure 14:
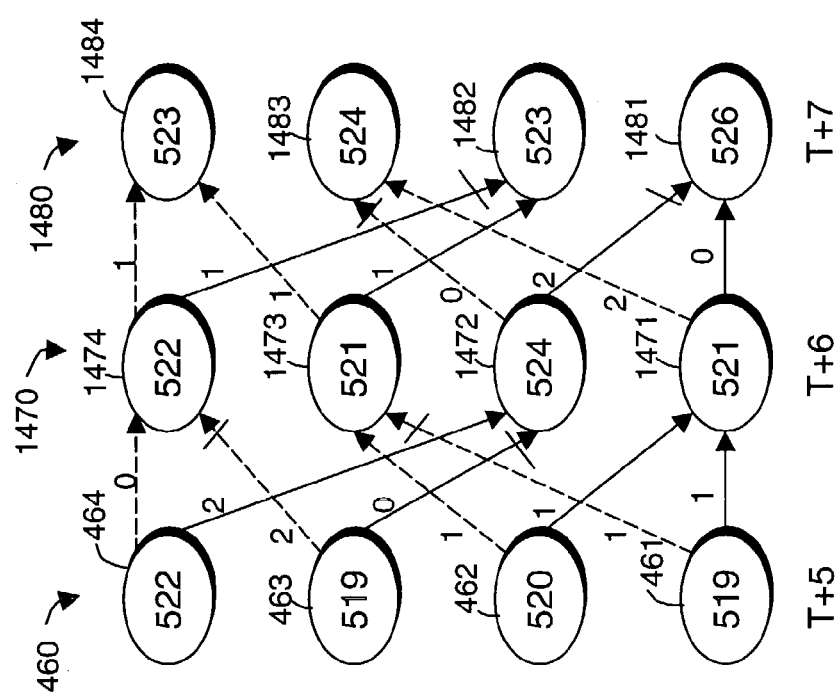
FIG. 14 is a trellis diagram illustrating exemplary state metrics and survivor paths determined for the states of the encoder of FIG. 2 during time interval T+5 through T+7.

FIG. 5 illustrates exemplary branch metric values for the paths that lead to the states during time interval T through T+5 for the convolutional encoder shown in FIG. 2. In this example, the convolutional encoder 200 (shown in FIG. 2) receives input values 1, 0, 0, 1, 1 and generates and transmits coded values (C1, C2) 11, 01, 11, 11, 10 during time periods T through T+4 respectively. Extending this example, the convolutional encoder 200 receives additional input values 0, 0 and generates and transmits coded values (C1,C2) 10 and 11 during time periods T+6 and T+7. FIG. 14 is a trellis diagram that illustrates the state metrics and survivor paths for the state during time interval T+5 through T+7. For the terminated input data stream, traceback starts at state 0 1481 at T+7.

Figure 15:
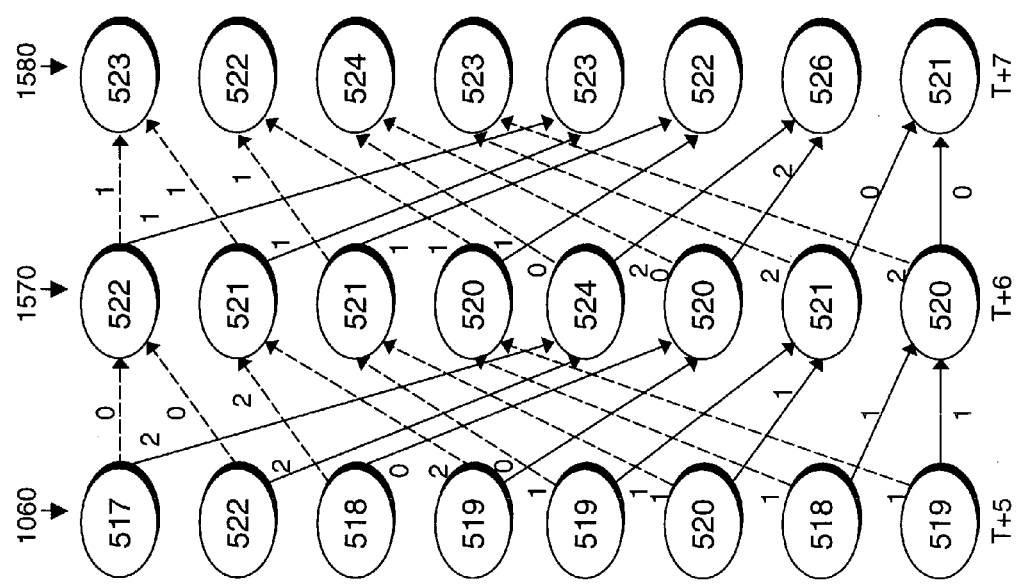
FIG. 15 is a trellis diagram illustrating exemplary state metrics and survivor paths determined for the states of the encoder of FIG. 8 during time interval T+5 through T+7.

FIG. 12 illustrates exemplary branch metric values for the paths that lead to the states during time interval T through T+5 for the convolutional encoder shown in FIG. 8. In this example, the convolutional encoder 800 (shown in FIG. 8) receives input values 1, 0, 0, 1, 1 and generates and transmits coded values (C1, C2) 11, 01, 11, 11, 10 during time periods T through T+4 respectively. Extending this example, the convolutional encoder 200 receives additional input values 0, 0 and generates and transmits coded values (C1,C2) 10 and 11 during time periods T+6 and T+7. FIG. 15 is a trellis diagram that illustrates the state metrics and survivor paths for the states during time interval T+5 through T+7. Traceback may begin at either state 0 1481 or state 1 1482. Since state 1 has the high state metric value, traceback starts at state 1 1482 at T+7.

It should be appreciated that the present invention may be utilized for parallel Viterbi decoders where all state metrics are calculated in parallel as well as for serial Viterbi decoders where state metrics are calculated serially. In the case where the invention is utilized for serial Viterbi decoders, a trellis diagram having $2\exp(L_{current}-1)$ states may be implemented.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for performing Viterbi decoding, comprising:
   initializing selected states of an encoder during an initial time period in response to a constraint length of a code, $L_{current}$, and a maximum constraint length of a code supported, $L_{max}$, by assigning a unique state metric value to $2\exp(L_{max}-L_{current})$ states;
   determining branch metrics for states of the encoder;
   selecting survivor paths between the states of the encoder; and
   tracing back a path through the states of the encoder through the survivor paths.

2. The method of claim 1, wherein the $2\exp(L_{max}-L_{current})$ states include state 0, and every $2\exp(L_{current}-1)$ following state.

3. The method of claim 1, wherein the $2\exp(L_{max}-L_{current})$ states include state 0 to state $(2\exp(L_{max}-L_{current}))-1)$.

4. The method of claim 1, wherein initializing the selected states of the encoder during the initial time period comprises assigning a value to the selected states that is higher than those of non-selected states.

5. The method of claim 1, wherein initializing the selected states of the encoder during the initial time period comprises assigning a value to the selected states that is lower than those of non-selected states.

6. The method of claim 1, further comprising determining the constraint length of the code, $L_{current}$, from a generator polynomial.

7. The method of claim 1, wherein determining branch metrics for states of the encoder comprises determining differences between values associated with the states of the encoder and a code received.

8. The method of claim 1, wherein selecting the survivor paths between the states of the encoder comprises computing sums of branch metrics associated with paths with state metrics associated with states of originating the paths.

9. The method of claim 1, wherein tracing back a path through the states of the encoder through the survivor paths comprises starting a traceback at a state having a highest state metric value at a time period.

10. The method of claim 1, wherein tracing back a path through the states of the encoder through the survivor path comprises:
determining which one of states 0 through state $(2\exp(L_{max}-L_{current}))-1$ has a highest state metric value; and
beginning traceback at the state having the highest state metric value.

11. The method of claim 1, wherein tracing back a path through the states of the encoder through the survivor paths comprises:
determining which one of states 0 and every $2\exp(L_{current}-1)$th state has a highest state metric value; and
beginning traceback at the state having the highest state metric value.

12. A method for performing Viterbi decoding, comprising:
determining a constraint length of a code received, $L_{current}$;
initializing selected states of an encoder during an initial time period in response to $L_{current}$, and a maximum constraint length of a code that is supported, $L_{max}$, by assigning a unique state metric value to $2\exp(L_{max}-L_{current})$ states;
determining branch metrics for states of the encoder;
selecting survivor paths between the states of the encoder; and
tracing back a path through the states of the encoder through the survivor paths.

13. The method of claim 12, wherein the $2\exp(L_{max}-L_{current})$ states include state 0, and every $2\exp(L_{current}-1)$ following state.

14. The method of claim 12, wherein the $2\exp(L_{max}-L_{current})$ states include state 0 to state $(2\exp)L_{max}-L_{current}))-1)$.

15. The method of claim 12, wherein initializing the selected states of the encoder during the initial time period comprises assigning a value to the selected states that is higher than those of non-selected states.

16. The method of claim 12, wherein initializing the selected states of the encoder during the initial time period comprises assigning a value to the selected states that is lower than those of non-selected states.

17. The method of claim 12, further comprising determining the constraint length of the code, $L_{current}$, from a generator polynomial.

18. The method of claim 12, further comprising:
determining branch metrics for states of the encoder;
selecting survivor paths between the states of the encoder; and
tracing back a path through the states of the encoder through the survivor paths.

19. A Viterbi decoder capable of decoding a code having a maximum constraint length of $L_{max}$, comprising:
an initializer unit to initialize selected states of an encoder during an initial time period by assigning a unique state metric value to $2\exp(L_{max}-L_{current})$ states, where $L_{current}$ is a constraint length of a code to be decoded to allow the Viterbi decoder to also decode codes having a constraint length less than $L_{max}$;
a constraint length processor to determine a constraint length of a code from a generator polynomial;
a branch metric processor to determine branch metrics for states of the encoder;
a survivor processor to select survivor paths between the states of the encoder; and
a traceback unit to trace back a path through the states of the encoder through the survivor paths.

20. The Viterbi decoder of claim 19, wherein the $2\exp(L_{max}-L_{current})$ states includes state 0, and every $2\exp(L_{current}-1)$ following state, where $L_{current}$ is a constraint length of a code to be decoded.

21. The Viterbi decoder of claim 19, wherein the $2\exp(L_{max}-L_{current})$ states include state 0 to state $(2\exp)(L_{max}-L_{current}))-1)$, where $L_{current}$ is a constraint length of a code to be decoded.

22. The Viterbi decoder of claim 19, wherein the initializer unit assigns a value to the selected states that is higher than those of non-selected states.

23. The Viterbi decoder of claim 19, wherein the initializer unit assigns a value to the selected states that is lower than those of non-selected states.

24. The Viterbi decoder of claim 19, further comprising:
a constraint length processor to determine a constraint length of a code from a generator polynomial.

25. The Viterbi decoder of claim 19, further comprising:
a branch metric processor to determine branch metrics for states of the encoder;
a survivor processor to select survivor paths between the states of the encoder; and
a traceback unit to trace back a path through the states of the encoder through the survivor paths.

26. A Viterbi decoder, comprising:
an initializer unit to initialize selected states of an encoder during an initial time period in response to a constraint length of a code, $L_{current}$, and a maximum constraint length supported by the Viterbi decoder, $L_{max}$, wherein the initializer unit assigns a unique state metric value to $2\exp(L_{max}-L_{current})$ states;
a branch metric processor to determine branch metrics for states of the encoder;
a survivor processor to select survivor paths between the states of the encoder; and
a traceback unit to trace back a path through the states of the encoder through the survivor paths.

27. The Viterbi decoder of claim 26, wherein the 2exp ($L_{max}-L_{current}$) states include state 0, and every 2exp ($L_{current}-1$) following state.

28. The Viterbi decoder of claim 26, wherein the 2exp ($L_{max}-L_{current}$) states include state 0 through state (2exp ($L_{max}-L_{current}$))−1).

29. The Viterbi decoder of claim 26, wherein the initializer unit assigns a value to the selected states that is higher than those of non-selected states.

30. The Viterbi decoder of claim 26, wherein the initializer unit assigns a value to the selected states that is lower than those of non-selected states.

31. The Viterbi decoder of claim 26, further comprising a constraint length processor that determines the constraint length of the code $L_{current}$, from a generator polynomial.

32. A method for performing Viterbi decoding, comprising:
  initializing selected states of an encoder during an initial time period in response to a constraint length of a code, $L_{current}$, and a maximum constraint length of a code supported, $L_{max}$, by assigning a value to the selected states that is higher than those of non-selected states;
  determining branch metrics for states of the encoder;
  selecting survivor paths between the states of the encoder; and
  tracing back a path through the states of the encoder through the survivor paths.

33. A method for performing Viterbi decoding, comprising:
  initializing selected states of an encoder during an initial time period in response to a constraint length of a code, $L_{current}$, and a maximum constraint length of a code supported, $L_{max}$, by assigning a value to the selected states that is lower than those of non-selected states;
  determining branch metrics for states of the encoder;
  selecting survivor paths between the states of the encoder; and
  tracing back a path through the states of the encoder through the survivor paths.

34. A method for performing Viterbi decoding, comprising:
  initializing selected states of an encoder during an initial time period in response to a constraint length of a code, $L_{current}$, and a maximum constraint length of a code supported, $L_{max}$;
  determining a branch metrics for states of the encoder;
  selecting survivor paths between the states of the encoder; and
  tracing back a path through the states of the encoder through the survivor paths by determining which one of states 0 through state ($2exp(L_{max}-L_{current})$)−1 has a highest state metric values, and beginning traceback at the state having the highest state metric value.

35. A method for performing Viterbi decoding, comprising:
  initializing selected states of an encoder during an initial time period in response to a constraint length of a code, $L_{current}$, and a maximum constraint length of a code supported, $L_{max}$;
  determining branch metrics for states of the encoder;
  selecting survivor paths between the states of the encoder; and
  tracing back a path through the states of the encoder through the survivor paths by determining which one of states 0 and every $2exp(L_{current}-1)$th state has a highest state metric value, and beginning traceback at the state having the highest state metric value.

36. A method for performing Viterbi decoding, comprising:
  determining a constraint length of a code received, $L_{current}$;
  initializing selected states of an encoder during an initial time period in response to $L_{current}$, and a maximum constraint length of a code that is supported, $L_{max}$, by assigning a value to the selected states that is higher than those of non-selected states;
  determining branch metrics for states of the encoder;
  selecting survivor paths between the states of the encoder; and
  tracing back a path through the states of the encoder through the survivor paths.

37. A method for performing Viterbi decoding, comprising:
  determining a constraint length of a code received, $L_{current}$;
  initializing selected states of an encoder during an initial time period in response to $L_{current}$, and a maximum constraint length of a code that is supported, $L_{max}$, by assigning a value to the selected states that is lower than those of non-selected states;
  determining branch metrics for states of the encoder;
  selecting survivor paths between the states of the encoder; and
  tracing back a path through the states of the encoder through the survivor paths.

38. A Viterbi decoder capable of decoding a code having a maximum constraint length of $L_{max}$, comprising:
  an initializer unit to initialize selected states of an encoder during an initial time period to allow the Viterbi decoder to also decode codes having a constraint length less than $L_{max}$ by assigning a value to the selected states that is higher than those of non-selected states;
  a constraint length processor to determine a constraint length of a code from a generator polynomial;
  a branch metric processor to determine branch metrics for states of the encoder;
  a survivor processor to select survivor paths between the states of the encoder; and
  a traceback unit to trace back a path through the states of the encoder through the survivor paths.

39. A Viterbi decoder capable of decoding a code having a maximum constraint length of $L_{max}$, comprising:
  an initializer unit to initialize selected states of an encoder during an initial time period to allow the Viterbi decoder to also decode codes having a constraint length less than $L_{max}$ by assigning a value to the selected states that is lower than those of non-selected states;
  a constraint length processor to determine a constraint length of a code from a generator polynomial;
  a branch metric processor to determine branch metrics for states of the encoder;
  a survivor processor to select survivor paths between the states of the encoder; and
  a traceback unit to trace back a path through the states of the encoder through the survivor paths.

40. A Viterbi decoder, comprising:
  an initializer unit to initialize selected states of an encoder during an initial time period in response to a constraint length of a code, $L_{current}$, and a maximum constraint length supported by the Viterbi decoder, $L_{max}$, by assigning a a value to the selected states that is higher than those of non-selected states;
  a branch metric processor to determine branch metrics for states of the encoder;
  a survivor processor to select survivor paths between the states of the encoder; and a traceback unit to trace back a path through the states of the encoder through the survivor paths.

41. A Viterbi decoder, comprising:

an initializer unit to initialize selected states of an encoder during an initial time period in response to a constraint length of a code, $L_{current}$, and a maximum constraint length supported by the Viterbi decoder, $L_{max}$, by assigning a value to the selected states that is lower than those of non-selected states;

a branch metric processor to determine branch metrics for states of the encoder;

a survivor processor to select survivor paths between the states of the encoder; and a traceback unit to trace back a path through the states of the encoder through the survivor paths.

\* \* \* \* \*